(12) United States Patent
Hagiwara et al.

(10) Patent No.: US 6,927,380 B2
(45) Date of Patent: Aug. 9, 2005

(54) RADIATION-IMAGE DATA READOUT APPARATUS AND LINE SENSOR TO BE UTILIZED THEREIN

(75) Inventors: Tatsuya Hagiwara, Miyagi-ken (JP); Jin Murayama, Miyagi-ken (JP); Tetsuo Yamada, Miyagi-ken (JP); Satoshi Arakawa, Kaisei-machi (JP); Hiroaki Yasuda, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 106 days.

(21) Appl. No.: 10/060,188

(22) Filed: Feb. 1, 2002

(65) Prior Publication Data

US 2002/0100887 A1 Aug. 1, 2002

(30) Foreign Application Priority Data

Feb. 1, 2001 (JP) ........................................ 2001-025239

(51) Int. Cl.[7] ........................... H01L 27/00; H01L 31/00
(52) U.S. Cl. ............................... 250/208.1; 250/214.1; 257/185; 257/291
(58) Field of Search ................................. 257/291, 293, 257/185, 294, 184, 290, 292, 458, 459; 250/214.1, 235, 208.1, 484.2, 484.4, 586

(56) References Cited

U.S. PATENT DOCUMENTS

| | | | |
|---|---|---|---|
| 4,258,264 A | | 3/1981 | Kotera et al. |
| 4,276,473 A | | 6/1981 | Kato et al. |
| 4,387,428 A | | 6/1983 | Ishida et al. |
| 4,527,182 A | * | 7/1985 | Ishihara et al. ............. 257/223 |
| 4,816,679 A | | 3/1989 | Sunagawa et al. |
| 4,922,103 A | | 5/1990 | Kawajiri et al. |
| 5,043,571 A | * | 8/1991 | Hasegawa ................... 250/226 |
| 5,340,977 A | * | 8/1994 | Kojima et al. ........... 250/208.1 |
| 5,723,877 A | * | 3/1998 | Sugawa et al. ................ 257/59 |
| 5,920,063 A | * | 7/1999 | Kawamoto et al. ...... 250/208.1 |
| 6,337,495 B1 | * | 1/2002 | Kim ........................... 257/232 |
| 6,492,655 B2 | * | 12/2002 | Yasuda ....................... 250/587 |
| 6,515,270 B1 | * | 2/2003 | Isoda ....................... 250/208.1 |
| 6,740,908 B1 | * | 5/2004 | Giboney ..................... 257/185 |
| 2003/0085339 A1 | * | 5/2003 | Janesick .................. 250/208.1 |

FOREIGN PATENT DOCUMENTS

| | | | |
|---|---|---|---|
| JP | 1-101540 | | 4/1989 |
| JP | 01101540 A | * 4/1989 | ........... G03B/42/02 |
| JP | 09307133 A | * 11/1997 | ........... H01L/31/10 |

* cited by examiner

Primary Examiner—Gail Verbitsky
Assistant Examiner—Mirellys Jagan
(74) Attorney, Agent, or Firm—Sughrue Mion, PLLC (57) ABSTRACT

The charge read out efficiency of a line sensor utilizing a large photodiode is improved. A line sensor formed of a photoelectric converting portion utilizing a photodiode divided into a plurality of regions and having a potential inclination configuration wherein the potential wells thereof become deeper the closer the position thereof is to a readout gate is provided.

15 Claims, 7 Drawing Sheets

SECT I-I

AOB CROSS-SECTION
CROSS-SECTIONAL
VIEW OF POTENTIAL

F I G. 6C

COB CROSS-SECTION
CROSS-SECTIONAL
VIEW OF POTENTIAL

RADIATION-IMAGE DATA READOUT APPARATUS AND LINE SENSOR TO BE UTILIZED THEREIN

BACKGROUND OF THE INVENTION

1. Field of the Invention

The present invention relates in general to a line sensor and a radiation-data readout apparatus, and in particular to a line sensor provided with a photodiode that serves as a photoelectric converting element and a radiation-image data readout apparatus.

2. Description of the Related Art

There are known line sensors wherein the light-receiving portion thereof comprises a plurality of photodiodes serving as photoelectric converting elements, which are arranged in a row and with a predetermined interval between each photodiode. In these line sensors, as shown in the side view of the line sensor depicted in FIG. 1A, the light-receiving surface (the shaded portion in FIG. 1A) of each photodiode 1, generates a quantity of electrical charge corresponding to the quantity of light energy received thereon. These charges are read out through a readout gate 2 in the direction of a charge transmitting portion 3 such as a CCD or the like, and are again transmitted by the transmitting device 3 to an external portion; such line sensors are widely applied in a number of fields as apparatuses for detecting light. For example, there are radiation-image data readout apparatuses for reading out the radiation-image data that has been recorded on a stimulable phosphor sheet and which comprise a built-in line sensor for detecting radiation.

The aforementioned stimulable phosphor sheet utilizes a layer containing stimulable phosphors (storable phosphors) formed on a substrate, which upon the irradiation thereof with radiation store a portion of the radiation energy thereof, and emit upon the subsequent irradiation thereof with a visible light, a laser light or other excitation light, a stimulated emission corresponding to the radiation energy stored therein. These stimulable phosphor sheets are widely used in conjunction with radiation-image recording and reproducing systems, wherein: the radiation-image data of a human body or other subject of photographing through which radiation has been passed is temporarily stored on a stimulable phosphor sheet; said stimulated phosphor sheet is scanned with a laser or other excitation light causing a stimulated emission to be emitted therefrom; said stimulated emission is photoelectrically read out sequentially by a photoelectric readout means to obtain an image signal and; on the other hand, said stimulable phosphor sheet is then irradiated with an erasing-light to erase the radiation energy remaining thereon (refer to Japanese Unexamined Patent Publication Nos. 55(1980)-12429, 55(1980)-116340, 56(1981)-104645, etc.).

Here, according to a radiation-image data readout apparatus to be employed in the above-described radiation-image recording and reproducing system: a line light source is used as the excitation light source for irradiating the sheet with an excitation light in a line form; a line sensor provided with a plurality of photodiodes arranged in a line along the lengthwise direction (herein after referred to as the main scanning direction) of the line-form portions of the sheet which have been irradiated with the excitation light by the line light source is employed as a photoelectric readout means; and a scanning means is provided for moving the line light source and the line sensor relatively from one end to the other of the sheet in the direction substantially perpendicular to the main scanning direction (hereinafter referred to as the subscanning direction) of the sheet; wherein the aim of this configuration is to obtain a shortening of the readout time and a reduction in the size and cost of the apparatus, have been proposed (refer to Japanese Unexamined Patent Publication Nos. 60(1985)-111568, 60(1985)-236354, 1(1988)-101540, etc.).

Figure 1A:
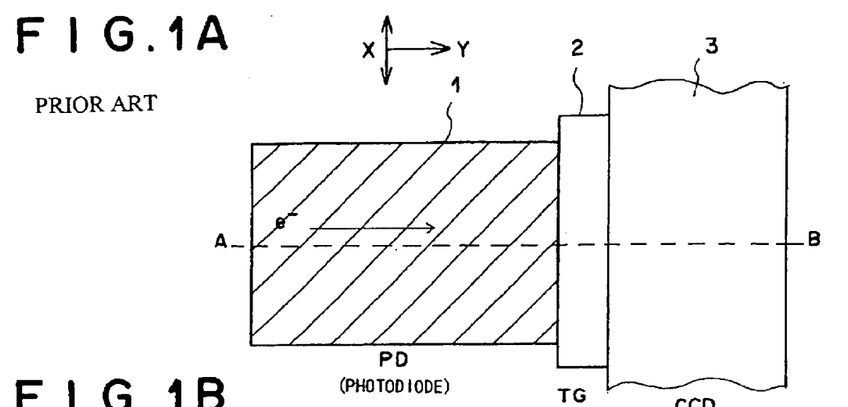
FIGS. 1A, 1B, and 1C are drawings illustrating an example of a currently available conventional technology.
Figure 1B:
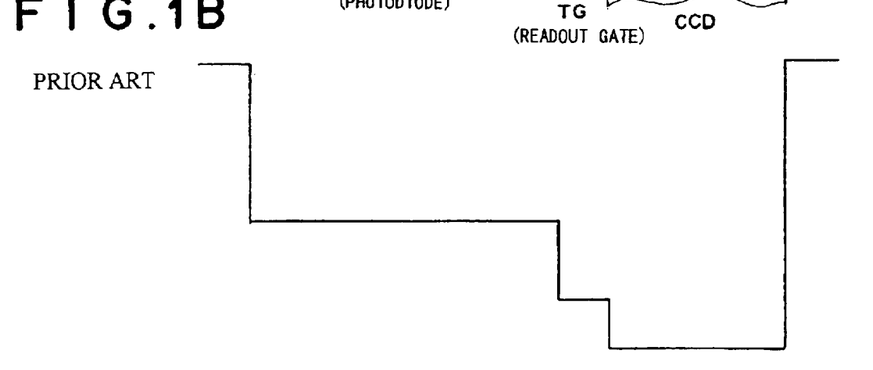

Incidentally, due to the fact that the potential well of the internal portion of the photodiode 1 of a conventional line sensor is shallower than that of the potential well of the lower portion of the readout gate 2, although read out of the charge is realized, the potential of the internal portion of the photodiode is the same. FIG. 1B shows the configuration of the potential along the line A-B of the line sensor shown in FIG. 1A. In order to raise the efficiency of photodetection, for cases in which a large photodiode is employed, that is, for cases in which the width occurring in the direction Y of the shaded portion shown in FIG. 1A is broad, because it takes an long period of time until the charge generated at a portion remote from the readout gate 2 reaches the readout gate 2, complete readout thereof is difficult, and the charge readout efficiency is poor. Therefore, a problem arises in that in order to completely readout the full charge, increases in the readout voltage and readout time cannot be avoided.

This problem is conspicuous in the radiation-image data readout apparatus described above as well. Because the stimulated emission emitted from the stimulable phosphor sheet is extremely faint, it is desirable that as much of the stimulated emission as possible is received; therefore, it is necessary to enlarge the size of the light-receiving area of the light-receiving portion, that is, to enlarge the dimension of each photodiode in the direction (in FIG. 1A, the direction indicated by the arrow Y) perpendicularly intersecting the direction in which the rows of photodiodes extend.

SUMMARY OF THE INVENTION

The present invention has been developed in consideration of the circumstances described above, and it is a primary objective of the present invention to provide a line sensor and a radiation-image data readout apparatus in which said line sensor is to be employed, wherein, even if a photodiode is employed, particularly a large photodiode, the charge readout efficiency of said line sensor and a radiation-image data readout apparatus in which said line sensor is to be employed is high.

The line sensor according to the present invention comprises: a photoelectric converting portion formed of a plurality of photodiodes disposed in a row at predetermined intervals; a charge transmitting portion for receiving and transmitting the charge from each of the photodiodes of the photoelectric converting portion; and a readout gate disposed between the photoelectric converting portion and the charge transmitting portion; wherein each said photodiode has a potential-inclination configuration such that the potential well thereof becomes deeper the closer said photodiode is disposed to the readout gate.

Further, the potential-inclination configuration is formed by pouring P-type and/or N-type ions into the photodiode.

That is to say, in contrast to the photodiodes occurring in a conventional line sensor, wherein the potential of the internal portion thereof is uniform across the entire span of the line sensor, the photodiodes according to the present invention have a potential-inclination configuration; wherein, viewed from the line of sight approaching the readout gate, the potential well of the photodiodes becomes deeper as the position thereof is closer to the readout gate.

Figure 1C:
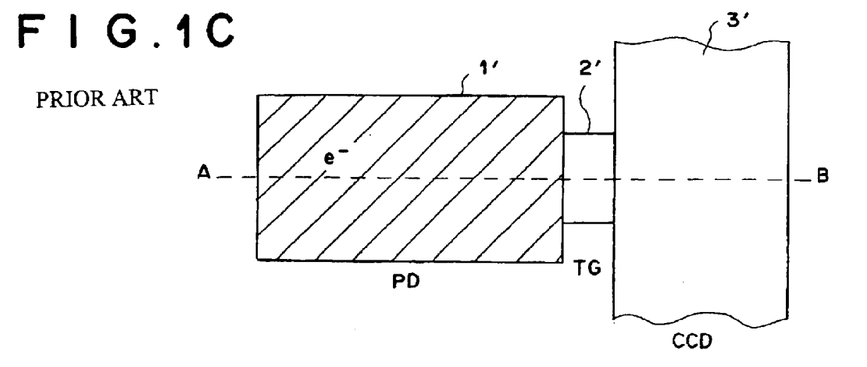

Here, the referents of "the potential well of the photodiodes becomes deeper the closer to the readout gate the position thereof is" include of course, that the depth of the potential wells increases in the direction indicated by the arrow Y, as shown in the example depicted in FIG. 1A, for example, but also include, as shown in the example depicted in FIG. 1C, that for cases in which the width direction of the readout gate 2', which is indicated by the arrow X in FIG. 1A, is narrower than the width occurring inn the same direction of the same photodiode 1', the depth of the potential well becomes deeper toward the center portion of the of the readout gate in the direction substantially perpendicularly intersecting the direction indicated by the arrow Y.

Further, so far as the potential of the internal portion of the photodiode is of a configuration such that the potential well thereof becomes deeper the closer the position of said photodiode is to the readout gate, the potential-inclination configuration can be of any configuration. For example, from the position furthest removed from the readout gate to the position closest to the readout gate, the potential wells of the photodiodes can of course be of a configuration wherein the depth thereof becomes progressively deeper at a uniform gradient the closer to the readout gate the position of the photodiode is, or for cases in which the photodiode is divided into a plurality of regions, the potential-inclination configuration can be a stepped inclination configuration, wherein the closer to the readout gate the position of the region is, the deeper the potential well thereof becomes. However, from the standpoint of simplified processing and manufacture thereof, it is preferable that the potential-inclination configuration is the stepped inclination configuration described above.

Still further, for cases in which the potential-inclination configuration is a stepped inclination configuration, it is more advantageous if the border between two adjacent regions has a forward-tapered shape such that the width thereof becomes narrower the further said region is removed from the readout gate.

In addition, for cases in which the potential-inclination configuration is a stepped inclination configuration, it is further advantageous if the border between two adjacent regions is of a plurality of forward-tapered shapes that become narrower the further said region is removed from the readout gate arranged so as to form a zigzag shape.

Note that according to the line sensor described above, a CCD can be employed as the charge transmitting portion.

The radiation-image data readout apparatus of the present invention comprises: a line light source for irradiating with an excitation light in a line-form a portion of a stimulable phosphor sheet on which radiation-image data has been recorded; a line sensor for receiving and photoelectrically converting the stimulated emission emitted from a portion of the stimulable phosphor sheet upon the irradiation thereof with the excitation light in a line-form; a scanning means for moving the line light source and the line sensor relatively from one end to the other of the phosphor sheet in the direction different from the lengthwise direction of the portions of the phosphor sheet irradiated by the excitation light; and a readout means for sequentially reading out, corresponding to the movement of the scanning means, the output of the line sensor; wherein the line sensor is provided with a photoelectric converting portion formed of photodiodes having the above-described potential-inclination configuration.

Here, as to the line light source, a fluorescent bulb, a cold cathode fluorescent bulb, an LED array or the like can be employed. Further, the line light source is not limited to being a light source wherein the actual aforementioned fluorescent bulb or the like forming the light source is in the form of a line, but can also include a light source in which the emitted excitation light is caused to be transformed into a line-form, and includes a broad area laser, etc. The excitation light emitted from the line light source can be an excitation light emitted in a continuous manner, or a pulse light emitted in a pulse form where in the emission of the excitation light is repeatedly stopped; however, from the standpoint of reducing noise, it is desirable that a high-output pulse light is employed.

Further, as to the direction in which the line light source and the line sensor are moved relative to the stimulable phosphor sheet (a direction different from the lengthwise direction of the line light source and the line sensor), although it is desirable that said direction is the direction intersecting the lengthwise direction of the line light source and the line sensor substantially perpendicularly, the direction is not limited to being a substantially perpendicular direction; for example, within the range in which a uniform excitation light can be irradiated across substantially the entire surface of the phosphor sheet, the direction in which the line light source and the line sensor are to be moved can be a direction diverging at a diagonal from the aforementioned substantially perpendicularly intersecting direction, or a direction that changes in a zigzag form, for example.

Note that the line light source and the line sensor can be provided in a configuration wherein both are disposed on the same side of the stimulable phosphor sheet, or in a configuration wherein each is disposed separately on mutually opposite sides of the sheet. However, for cases in which they are provided separately on mutually opposite sides of the sheet, it is necessary that the substrate, etc. of the sheet exhibit transparency with respect to the stimulable emission so that the stimulable emission is transmitted through the side of the sheet opposite that through which the excitation light enters.

As to the stimulable phosphor sheet for recording the radiation-image data, of course a standard stimulable phosphor sheet containing stimulable phosphors combining both the function of absorbing radiation and the function of accumulating radiation energy, that is, radiation-image data, can be employed; however, if a system such as that disclosed in Japanese Unexamined Patent Publication No. 11 (1999)-372978, wherein the stimulable phosphor sheet utilized therein separates the radiation absorbing function and the energy absorbing function found in conventional stimulable phosphor sheets by using a stimulable phosphor exhibiting excellent radiation absorbing properties and a stimulable phosphor exhibiting excellent stimulated emission responsiveness for absorbing radiation and accumulating radiation-image data, respectively; wherein the stimulable phosphor exhibiting excellent radiation absorption properties (specialized radiation-absorption phosphor) absorbs radiation and is caused to emit light in the visible to ultraviolet range, and this emitted light is absorbed and accumulated by use of the stimulable phosphor exhibiting excellent stimulated emission responsiveness (specialized energy-accumulation phosphor) and said energy is caused to be emitted as a stimulated emission by the excitation, by use of light in the visible to infrared range, of the specialized energy-accumulation stimulable phosphors that have accumulated said energy, and said emitted stimulated emission is sequentially photoelectrically read out by a readout means to obtain an image signal, is employed, because the quantitative efficiency of the detection of the radiation-image form, that is, the radiation absorption ratio, the efficiency of emitting and reading out the stimulated emission, etc., can be improved overall, it is preferable that the stimulable phosphor sheets to be employed in the radiation-image data readout apparatus according to the present invention are stimulable phosphor sheets containing the aforementioned specialized energy-accumulation phosphors.

Here, although the light in the visible to ultraviolet range that have been emitted by the specialized radiation-absorption phosphors and then absorbed and accumulated by the specialized energy-accumulation stimulable phosphors is read out as image data, because the emitted light in the visible to ultraviolet range has been emitted from the specialized radiation-absorption stimulable phosphors that have absorbed radiation, the image data accumulated on the specialized energy-accumulation stimulable phosphors is also taken as radiation-image data.

Further, in order to raise the degree of light-reception of the line sensor, that is, the rate of reception by the line sensor of the stimulated emission emitted from each portion of the stimulated sheet, a focusing optical system for focusing the stimulated emission onto the light-receiving surface of the line sensor can be provided between the stimulable phosphor sheet and the line sensor, and it is preferable that said focusing optical system is an optical system having a 1:1 or an enlarging magnification rate.

Still further, it is preferable that an excitation light cutoff filter (a sharp cut filter, a band-pass filter) that transmits the stimulated emission and does not transmit the excitation light be provided between the stimulable phosphor sheet and the line sensor, so as to prevent the excitation light from being received at the line sensor.

According to the line sensor of the present invention, because each photodiode forming the photoelectric converting portion has a potential-inclination configuration such that the potential well thereof becomes deeper the closer said photodiode is disposed to the readout gate, the reading out of the charges generated in the internal portion of the photodiodes is facilitated, and even for cases in which the photodiodes are of a large size, it is possible to complete a full readout of the charges without incurring increases in the readout voltage and readout time, whereby the charge readout efficiency can be improved.

Further, if the photodiode is divided into a plurality of regions, the potential-inclination configuration can be a stepped inclination configuration, wherein the closer to the readout gate the position of the region is, the deeper the potential well thereof becomes, and the manufacture thereof becomes simplified.

Still further, if the border between two adjacent regions from among the plurality of regions has a forward-tapered shape such that the width thereof becomes narrower the further said region is removed from the readout gate, because the charge transmission distance from an region having a certain potential to an region adjacent thereto becomes shorter, the charge transmitting efficiency can be further improved.

In addition, if the border between two adjacent regions from among the plurality of regions is of a plurality of forward-tapered shapes that become narrower the further said region is removed from the readout gate arranged so as to form a zigzag shape, because the form of the regions becomes a narrow pattern and a narrow-channel effect is obtained, the charge transmitting efficiency can be even further improved.

Additionally, if the line sensor according to the present invention is applied in a radiation-image readout apparatus for reading out radiation-imaged at a recorded on a stimulable phosphor sheet, even if the photodiode forming the light-receiving portion is a large photodiode, because charge transmission can be performed efficiently, as described above, when performing readout of the radiation-image data stored on a stimulable phosphor sheet, the area of the light-receiving portion of the line sensor can be enlarged and the readout efficiency of the stimulated emission can be improved.

DESCRIPTION OF THE PREFERRED EMBODIMENTS

Hereinafter the preferred embodiments of the line sensor and the radiation-image data readout apparatus in which said line sensor is utilized according to the present invention will be explained with reference to the attached drawings.

Figure 2:
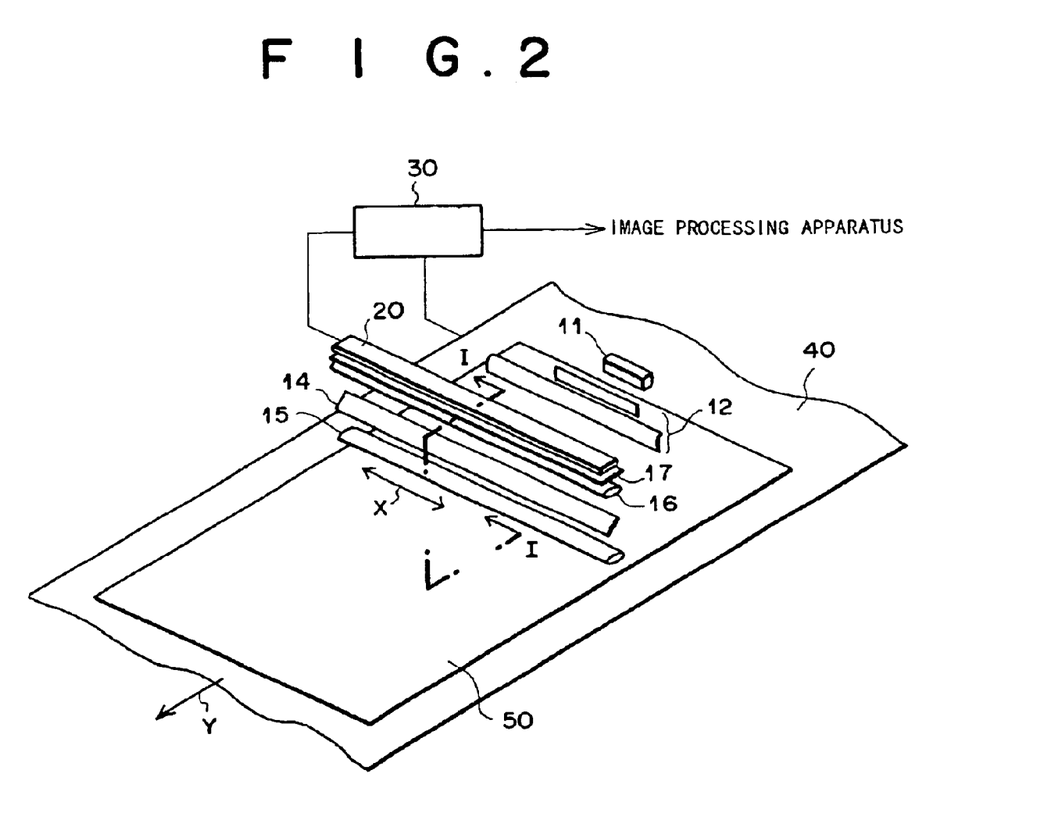
FIG. 2 is a schematic drawing of a first embodiment of the radiation-image data readout apparatus utilizing the line sensor according to present invention.
Figure 3:
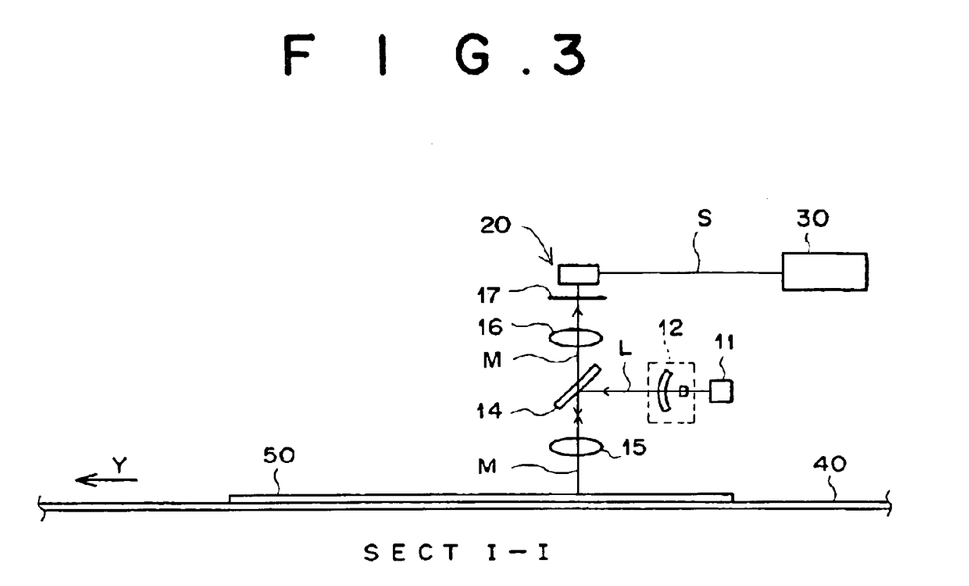
FIG. 3 is a cross-sectional view of the radiation-image data readout apparatus shown in FIG. 2 taken along the line I—I.
Figure 4:
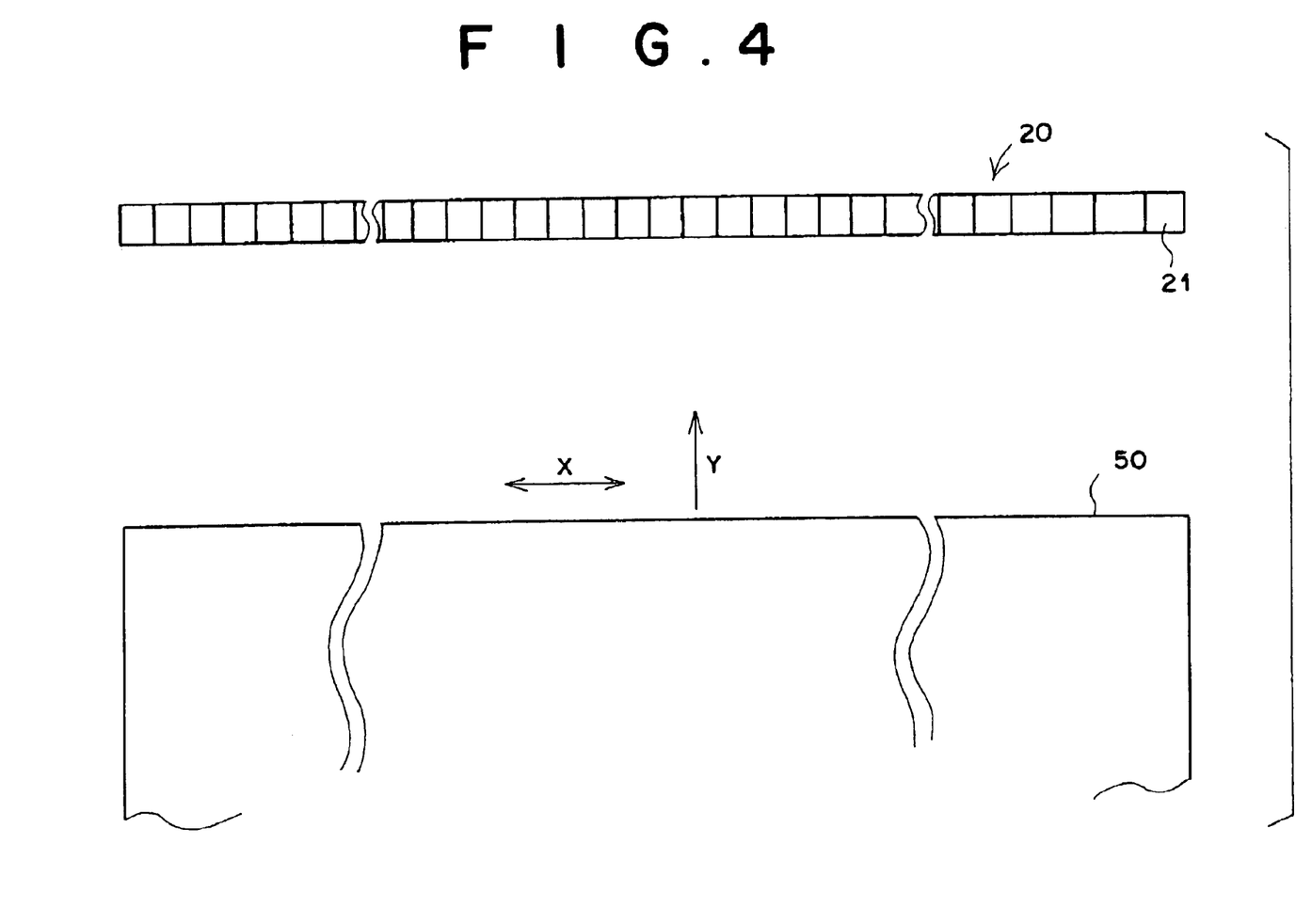
FIG. 4 is a detailed drawing of the line sensor utilized in the radiation-image data readout apparatus shown in FIGS. 2 and 3, FIGS. 5A and 5B are detailed drawing of each photoelectric converting element of the first embodiment of the line sensor according to the present invention.

FIG. 2 shows a perspective view of the first embodiment of the line sensor and the radiation-image data readout apparatus in which said line sensor is utilized according to the present invention. FIG. 3 shows a cross-sectional view taken along the line I—I of the radiation-image data readout apparatus shown in FIG. 1. FIG. 4 is a drawing of the detailed configuration of the line sensor 20 shown in FIGS. 2 and 3. FIG. 5 is an enlarged drawing of the detailed configuration of each photoelectric converting element 21 forming the line sensor 20 shown in FIG. 4.

The radiation-image data readout apparatus shown in FIG. 2 comprises: a scanning belt 40 for conveying in the direction indicated by the arrow Y a stimulable phosphor sheet (hereinafter referred to simply as a sheet) 50 on which radiation-image data has been cumulatively recorded and which has been loaded onto the scanning belt 40; a broad area laser (hereinafter referred to as a BLD) 11 for irradiating the surface of the sheet 50 in a substantially parallel direction with a 2-dimensional line-form excitation light (hereinafter referred to simply as excitation light) L, which has a line width of substantially 100 um; an optical system 12 formed of an assembly consisting of a collimator lens for focusing the line-form excitation light L emitted from the BLD 11 and a toric lens for unidirectionally expanding the beam thereof; a dichroic mirror 14, which is disposed at a 45 degree angle with respect to the surface of the sheet 50, for reflecting the excitation light L and transmitting the stimulated emission M, which is described below;

a lens array 15 (a lens formed of a plurality of refractive index distribution lenses, and hereinafter referred to as a first Selfoc lens array), which is a refractive index distribution type lens array for focusing onto the sheet 50 the excitation light L reflected by the dichroic mirror 14 in a line form (substantially 100 um in width) extending in the direction indicated by the arrow X, and converting the stimulated emission M emitted from the phosphor sheet 50 upon the irradiation thereof by the excitation light and which corresponds to the radiation energy stored on said phosphor sheet 50 to a parallel light flux;

a second Selfoc lens array 16 for focusing onto the photodiode portions 22 forming the light-receiving portion of each of the photoelectric converting elements 21 the of a line sensor 20, which is described below, the stimulated emission M that has been converted to a parallel light flux by the first Selfoc lens array 15 and reflected by the dichroic mirror 14; an excitation light cutoff filter 17 for cutting off the small amount of the excitation light L reflected from the surface of the phosphor sheet 50 that becomes mixed with the stimulated emission M transmitted by the second Selfoc lens array 16, and transmitting the stimulated emission M; a line sensor 20 for receiving and photoelectrically converting the stimulated emission M transmitted by the excitation light cutoff filter 17; and an image data readout means 30 for correlating the output of each of the photoelectric converting elements 21a to the corresponding position on the sheet 50 and performing a computational process therebetween, and outputting as an image signal the result obtained thereby.

The first Selfoc lens array 15 array serves as an imaging surface by which the image formed by the stimulated emission M of the phosphor sheet 50 is focused at a 1 to 1 magnification ratio on the dichroic mirror 14, and the second Selfoc lens array 16 array serves to focus onto the light-receiving portions the photoelectric converting elements 21 at a 1 to 1 magnification ratio the stimulated emission M occurring on the dichroic mirror 14.

Further, the optical system 12 formed of the aforementioned collimator lens and toric lens expands the excitation light L emitted from the BLD 11 onto a desired irradiation area on the phosphor sheet 50 above the dichroic mirror 14.

The line sensor 20, more specifically, is formed of a plurality of photoelectric converting elements 21 arranged along the sub-scanning direction (the direction indicated by the arrow X), as shown in FIG. 4. Further, as shown in FIG. 5A, the photoelectric converting elements 21, which receive the stimulated emission M emitted from the sheet 50 comprises a photodiode portion 22 (a light-receiving portion) for converting the received light of the stimulated emission M to a quantity of electric charge corresponding to the quantity of light thereof, and a CCD 24 for reading out the charge from the photodiode 22 through the readout gate 23 and transferring the read out charge to the readout means 30.

Figure 5A:
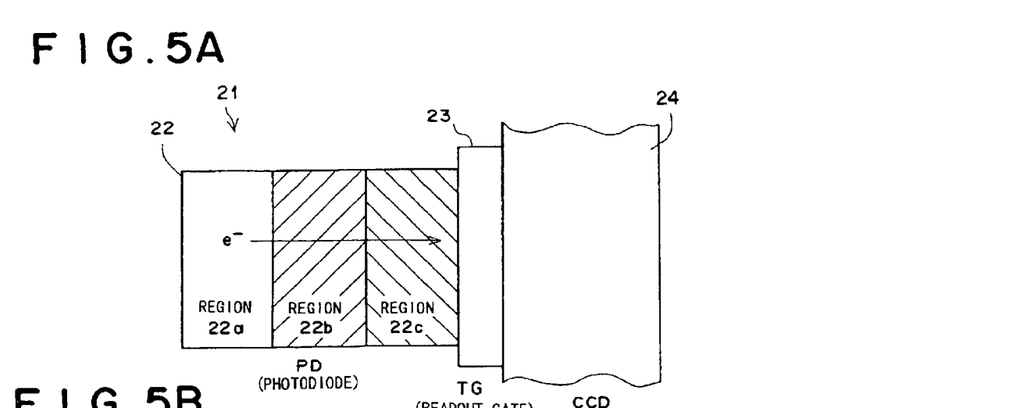

Further, as shown in FIG. 5A, according to the current embodiment, the photodiode 22 is formed of three regions 22a, 22b, 22c, into each of which a different quantity of ion particles have been poured, and which are of a configuration in which the potential well thereof becomes deeper the closer the position of said region is to the readout gate 23.

Still further, as to the ion particles to be poured into the regions, so far as the potential-inclination configuration described above is enabled, any ion particle can be employed. It is permissible that only P-type ion particles are poured into the regions, or also that only N-type ion particles are poured into the regions. Further, it is also permissible that P-type ion particles and N-type ion particles be poured into respective, separated portions of the regions.

Figure 5B:
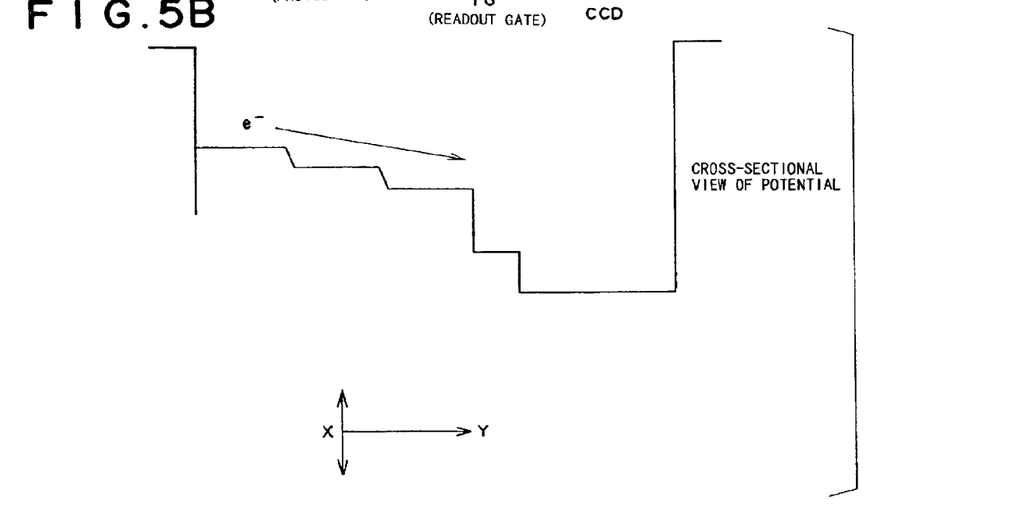

In this example, by pouring P-type ions into the regions so that the relation of the quantity of P-type ions in each region is region 22a>22b>22c, the potential-inclination configuration shown in FIG. 5B is obtained; however, the potential-inclination configuration shown in FIG. 5B can also be obtained by pouring N-type ions into the regions so that the relation of the quantity of N-type ions in each region is region 22a<22b<22c.

Note that according to the current embodiment, because the manufacturing process is simple, the potential within each of the regions (22a, 22b, and 22c) of the photodiode 22 has been made uniform, however, if a configuration is preserved wherein the depth of the potential well is deeper the closer the position of the region from the readout gate 23, the potential of each position within each region can be different. Further, although the manufacturing process becomes more difficult, instead of the stepped potential-inclination configuration shown in FIG. 5B, a potential-inclination configuration wherein the depth of the entire potential well of the photodiode 22 becomes deeper in a contiguous manner the closer the position thereof is to the readout gate 23 may be employed.

Next, the operation of the radiation-image readout apparatus according to the current embodiment will be explained.

First, by moving the scanning belt 40 in the direction of the arrow Y, the sheet 50 that has been loaded onto the scanning belt 40 and on which radiation image data has been recorded is conveyed in the direction of the arrow Y. At this time, the conveyance speed of the phosphor sheet 50 is equal to that of the scanning belt 40, and the speed of the belt 40 is input to the image readout means 30.

Meanwhile, BLD 11 projects the line-form excitation light L, having a line width of substantially 100 um, in a direction substantially parallel with respect to the surface of the phosphor sheet 50. This excitation light L is converted to a parallel beam by the optical system 12 formed of the collimator lens and the toric lens disposed on the optical path thereof, and reflected by the dichroic mirror 14 in a perpendicular direction so as to proceed in the direction oriented to enter the phosphor sheet 50 at a right angle; this reflected light is focused in to a line-form beam (the line width dL is substantially 100 um) on the sheet 50 extending in the direction indicated by the arrow X by the first Selfoc lens array 15.

Upon the irradiation of the sheet 50 by the excitation light L, a high-intensity stimulated emission M corresponding to the radiation image that has been cumulatively recorded on the phosphor sheet 50 is emitted from the focusing zone irradiated by the excitation light and the vicinity thereof. This stimulated emission M is converted to a parallel light flux and by the first Selfoc lens array 15, transmitted by the dichroic mirror 14, and focused onto the light-receiving surfaces of the light receiving portions (photodiodes) 22 of the photoelectric converting portions 21 forming the line sensor 20 by the second Selfoc lens array 16. At this time, the small amount of excitation light L reflected from the surface of the phosphor sheet 50 and included in the stimulated emission M transmitted by the second Selfoc lens array 16 is cutoff by the excitation light cutoff filter 17.

On the other hand, each of the photoelectric converting photodiodes 22 of each of the photoelectric converting portions 21 forming the line sensor 20 photoelectrically convert the light of the stimulated emission M received thereon, and electrical charges are generated at each region (22a, 22b, and 22c). These charges are transmitted via the readout gate 23 to the CCD 24, and then the CCD 24 transmits the read out charge signal, which is inputted to the readout means 30. The readout means 30 records, based on the movement speed of the scanning belt 40 and in a memory region correlated to each corresponding position of the sheet 50, the charge signal inputted thereto; afterwards, the readout means 30 outputs the recorded data as image data to an image processing apparatus.

According to the current embodiment, although for the sake of simplicity in explanation an example has been given in which the optical system disposed between the sheet 50 and the line sensor 20 has been set to focus at a 1:1 magnification ratio, of course, an enlarging and reducing optical system can be employed. However, from the standpoint of improving the focusing efficiency, it is preferable that a 1:1 magnification rate or an enlarging optical system is employed.

According to the radiation-image data readout apparatus utilizing the line sensor of the current embodiment: by pouring ion particles into each of the photodiodes 22 forming the light-receiving portion of the line sensor 20, because the potential-inclination configuration becomes a stepped potential-inclination configuration wherein the depth of the potential wells thereof become deeper the closer the position thereof is to the readout gate 23, when the charges generated in the internal portion of the photodiode portion 22 are to be read out to the CCD 24 through the readout gate 23, even if the width of the photodiode 22 occurring in the direction indicated by the arrow Y is broad, it is possible to achieve a full read out of the charge without incurring an increase in the readout voltage or the readout time. Further, because the photodiode 22 is divided into a plurality of regions (3 in the current example) and the potential-inclination configuration is a stepped potential-inclination configuration wherein the depth of the potential wells thereof becomes deeper the closer the position thereof is to the readout gate 23, the manufacturing process of the line sensor 20 is simple.

Figure 6A:
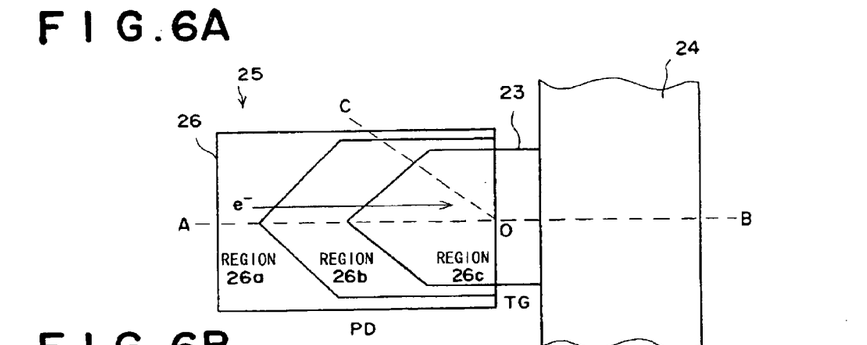
FIGS. 6A, 6B, and 6C are detailed drawings of each photoelectric converting element of the second embodiment of the line sensor according to the present invention.

FIG. 6A is a schematic drawing of each photoelectric converting element 25 of the second embodiment of the line sensor according to the present invention. The configuration of the photoelectric converting elements 25 shown in FIG. 6A can be applied as a second embodiment of a line sensor formed of a plurality of photoelectric converting elements 25 arranged in a line, as shown in FIG. 4, according to the present invention in the radiation-image data readout apparatus shown in FIG. 2.

Note that as to the radiation-image data readout apparatus in which the line sensor according to the second embodiment of the present invention is to be utilized, the structures and the functions of portions other than the line sensor are the same as those of the above described structures and functions of the radiation-image data readout apparatus utilizing the line sensor 20 according to the first embodiment of the present invention, except for those of the line sensor 20; therefore, in so far as it is not particularly required, further explanation thereof is omitted.

Figures 6B, 6C:
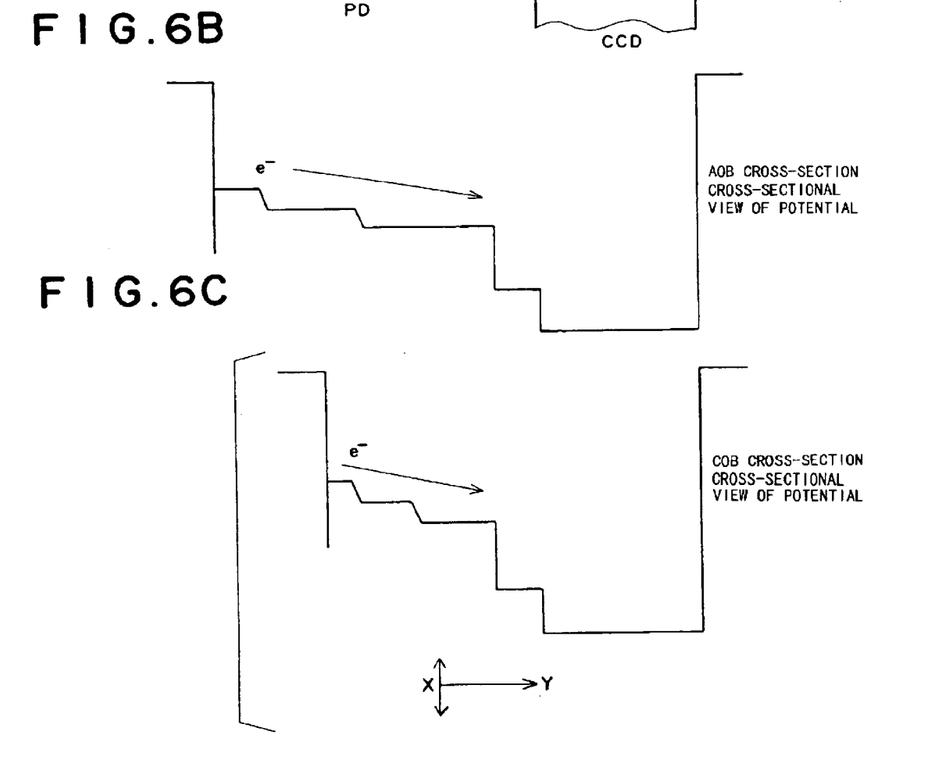

As shown in FIG. 6A, the photodiodes 26 of each of the photoelectric converting portions 25 forming the line sensor according to the second embodiment of the present invention have a width broader, in the direction indicated by the arrow X than the width of the readout gate 23 occurring in the same direction, and by pouring a different quantity of ion particles into each of the three regions into which the photodiode is divided (26a, 26b, and 26c), each said region is caused to have a different potential. FIGS. 6B and 6C show a cross-sectional view AOB and a cross-sectional view COB, respectively, of the potential of the photoelectric converting portions 25. As shown in FIGS. 6B and 6C, the relation between the potential depth of the regions 26a, 26b, and 26c is such that 26a<26b<26c, and said relation is not limited to the direction indicated by the arrow Y; from the line of sight of looking toward the readout gate 23, the potential-inclination configuration in any direction is such that the closer the position thereof is to the readout gate 23, the deeper the depth of the potential well is, and the border between the regions 26a and 26b and the border between the regions 26b and 26c have a forward-tapered shape, and the width thereof becomes narrower the further the distance thereof from the readout gate 23.

According to the radiation-image data readout apparatus utilizing the line sensor formed of a plurality of photoelectrical converting elements 25 having the configuration described above, that is, the line sensor according to the second embodiment of the present invention: because each photodiode 22 forming the light-receiving portion of the line sensor has a potential-inclination configuration wherein the depth of the potential wells thereof become deeper the closer the position thereof is to the readout gate 23, in the same manner as occurs in the radiation-image data readout apparatus utilizing the line sensor 20 according to the first embodiment described above, even if the width, in the direction indicated by the arrow Y, of the photodiode 22 is broad, it is possible to achieve a full read out of the charge while preventing an increase in the readout voltage or the readout time, and because the potential-inclination configuration has been formed such that not only in the direction indicated by the arrow Y, but in any direction from the line of sight of looking toward the readout gate 23, the potential-inclination configuration is such that the closer the position thereof is to the readout gate 23, the deeper the depth of the potential well is, even if the width, in the direction indicated by the arrow X, of the photodiode is broader than the width, in the same direction, of the readout gate, an improvement in the charge readout efficiency can be attained. Further, because the borderline between adjacent regions, as shown in FIG. 6A, has a forward-tapered shape, the distance a charge generated in a specific region has to travel to reach the next region is shortened, whereby the charge read out efficiency can be further improved.

Figure 7A:
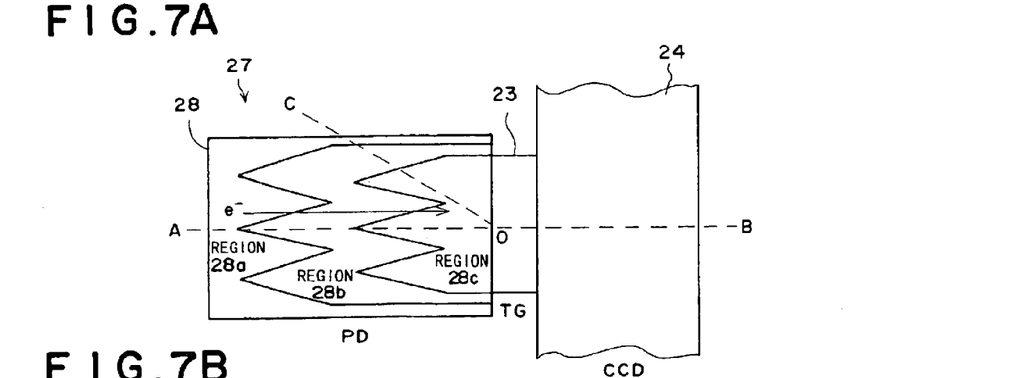
FIGS. 7A, 7B, and 7C are detailed drawings of each photoelectric converting element of the third embodiment of the line sensor according to the present invention.

FIG. 7A is a schematic drawing of each photoelectric converting element 27 of the second embodiment of the line sensor according to the present invention. The configuration of the photoelectric converting elements 27 shown in FIG. 7A can be applied as a third embodiment of a line sensor formed of a plurality of photoelectric converting elements 25 arranged in a line, as shown in FIG. 4, according to the present invention, in the radiation-image data readout apparatus shown in FIG. 2.

Note that as to the radiation-image data readout apparatus in which the line sensor according to the third embodiment of the present invention is to be utilized, the structures and the functions of portions other than the line sensor are the same as those of the above described structures and functions of the radiation-imaged at a readout apparatus utilizing the line sensors according to the first and second embodiments according of the present invention, respectively, except for those of the line sensor; therefore, in so far as it is not particularly required, further explanation thereof is omitted.

Figures 7B, 7C:
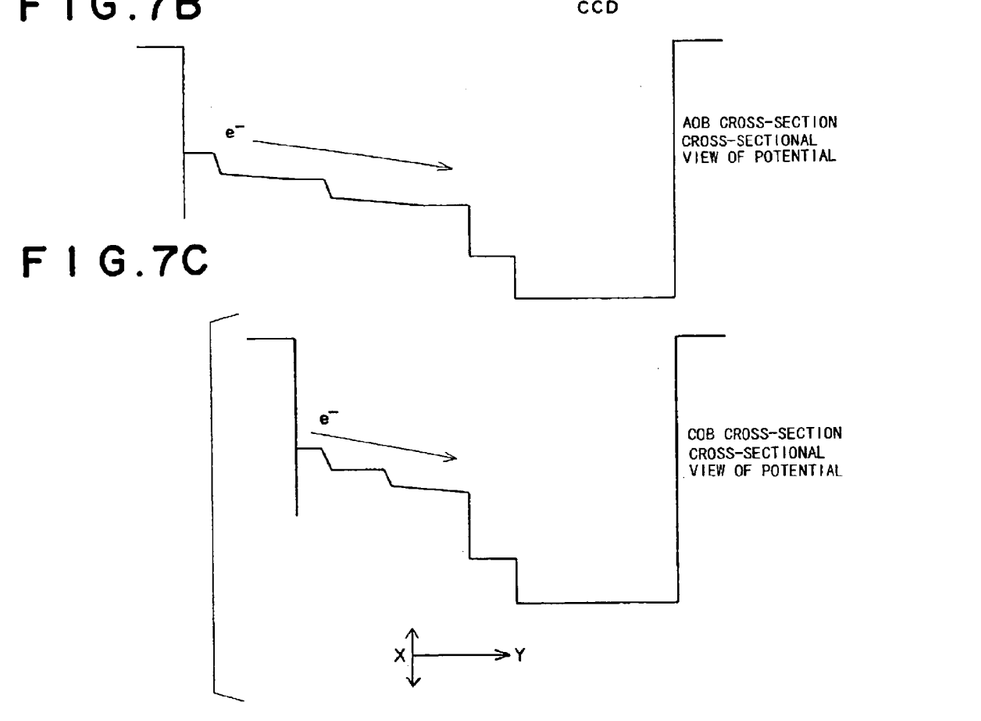

As shown in FIG. 7A, the photodiodes 28 of each of the photoelectric converting portions 27 forming the line sensor according to the third embodiment of the present invention have a width broader, in the direction indicated by the arrow X than the width of the readout gate 23 occurring in the same direction, and by pouring a different quantity of ion particles into each of the three regions into which the photodiode is divided (28a, 28b, and 28c), each said region is caused to have a different potential. FIGS. 7B and 7C show a cross-sectional view AOB and a cross-sectional view COB, respectively, of the potential of the photoelectric converting portions 27. As shown in FIGS. 7B and 7C, the relation between the potential depth of the regions 28a, 28b, and 28c is such that 28a<28b<28c, and said relation is not limited to the direction indicated by the arrow Y; from the line of sight of looking toward the readout gate 23, the potential-inclination configuration in any direction is such that the closer the position thereof is to the readout gate 23, the deeper the depth of the potential well is, and the border between the regions 28a and 28b and the border between the regions 28b and 28c is a plurality of forward-tapered shapes that become narrower the further said region is removed from the readout gate 23 arranged so as to form a zigzag shape.

According to the radiation-image data readout apparatus utilizing the line sensor formed of a plurality of photoelectrical converting elements 27 having the configuration described above, that is, the line sensor according to the third embodiment of the present invention: because each photodiode 28 forming the light-receiving portion of the line sensor has a potential-inclination configuration wherein the depth of the potential wells thereof become deeper the closer the position thereof is to the readout gate 23, in the same manner as occurs in the radiation-image data readout apparatus utilizing the line sensor 20 according to the first embodiment described above, even if the width, in the direction indicated by the arrow Y, of the photodiode 28 is broad, it is possible to achieve a full read out of the charge while preventing an increase in the readout voltage or the readout time, and because the potential-inclination configuration has been formed such that not only in the direction indicated by the arrow Y, but in any direction from the line of sight of looking toward the readout gate 23, the potential-inclination configuration is such that the closer the position thereof is to the readout gate 23, the deeper the depth of the potential well is, even if the width, in the direction indicated by the arrow X, of the photodiode is broader than the width, in the same direction, of the readout gate, an improvement in the charge readout efficiency can be attained. Further, because the borderline between adjacent regions, as shown in FIG. 7A, is a plurality of forward-tapered shapes that become narrower the further said region is removed from the readout gate 23 arranged so as to form a zigzag shape, the distance a charge generated in a specific region has to travel to reach the next region is shortened, and because a narrow-channel effect can be utilized, the charge read out efficiency can be further improved.

Note that the line sensor and the radiation-image data readout apparatus utilizing said line sensor according to the present invention are not limited to the above-described embodiments; as to the light source, the focusing optical system disposed between the light source and the sheet, the optical system disposed between the sheet and the line sensor, etc., a variety of known configurations thereof can be used therefore, respectively. Further, a configuration wherein an image processing apparatus for performing a variety of image processes on the signal outputted from the image-data readout apparatus is further provided, or a configuration wherein an erasing means for adequately dissipating the radiation energy remaining on the sheet after readout thereof has been completed is further provided, can also be adopted.

Further, according to the embodiments of the radiation-image data readout apparatus described above, a configuration in which the optical path of the excitation light L and the optical path of the stimulated emission M have been overlapped within one portion has been adopted with the aim of improving the compactness of the apparatus by a level, however, the radiation-image data readout apparatus according to the present invention is not limited to being of such configuration; for example, a configuration in which the optical path of the excitation light L and the optical path of the stimulated emission M are not overlapped whatsoever can be applied.

Still further, according to the embodiments of the radiation-image data readout apparatus described above, although a reflected-light focusing configuration, wherein both the line light source and the line sensor are provided on the same side of the stimulable phosphor sheet and the stimulated emission is received from the same surface of the sheet that the excitation light has entered, has been adopted, the radiation-image data readout apparatus according to the present invention is not limited to being of such configuration; by employing a stimulable phosphor sheet of which the substrate has been formed of a material exhibiting transparency with respect to the stimulable emission, a transmitted-light focusing configuration, wherein the excitation light source and the line sensor each provided separately on mutually different sides of the sheet and the stimulated emission is received from the opposite surface of the sheet from which the excitation light has entered, can be adopted.

In addition, as to the sheet to be employed in the embodiments of the radiation-image data readout apparatus described above, of course a standard stimulable phosphor sheet containing stimulable phosphors combining both the function of absorbing radiation and the function of accumulating radiation energy, that is, radiation-image data, can be employed; however, if a system such as that disclosed in Japanese Unexamined Patent Publication No. 11(1999)-372978, wherein the stimulable phosphor sheet utilized therein separates the radiation absorbing function and the energy absorbing function found in conventional stimulable phosphor sheets by using a phosphor exhibiting excellent radiation absorbing properties and a phosphor exhibiting excellent stimulated emission responsiveness for absorbing radiation and accumulating radiation-image data, respectively; wherein the phosphor exhibiting excellent radiation absorption properties (specialized radiation-absorption phosphor) absorbs radiation and is caused to emit light in the visible through ultraviolet range, and this emitted light is absorbed and accumulated by use of the phosphor exhibiting excellent stimulated emission responsiveness (specialized energy-accumulation phosphor) and said energy is caused to be emitted as a stimulated emission by the excitation, by use of light in the visible to infrared range, of the specialized energy-accumulation stimulable phosphors that have accumulated said energy, and said emitted stimulated emission is sequentially photoelectrically read out by a readout means to obtain an image signal, is employed; because the quantitative efficiency of the detection of the radiation-image form can be improved overall, if said specialized stimulable phosphor sheet is employed in conjunction with the radiation-image data readout apparatus according to the present invention, the image quality can be further improved.

Further, as a sheet to be employed in the radiation image data readout apparatus described above, a radiation energy subtraction sheet may be used. These sheets record two sets of image data, each having different radiation energy absorption characteristics, and emit stimulated emission corresponding to each set of image data separately from the front and rear surfaces thereof. Such a sheet may be used in conjunction with a line sensor on each side thereof in an apparatus that performs a subtraction process by corresponding the pixels of the image data read out from each side of the sheet. In this case as well, the line sensor constituted of photoelectric conversion elements having the photodiode structure described above may be employed as the line sensors provided on both sides of the sheet.

Additionally, as to the sheet to be used as a radiation-energy subtraction stimulable phosphor sheet, too, a sheet, for example, having a configuration wherein walls formed of a material exhibiting reflectivity with respect to the excitation light partition the sheet in the direction of the thickness thereof into a plurality of microscopic cells, etc., a so-called anisotropic sheet, can be used.

Further, according to each of the embodiments described above, the line sensor according to the present invention has been applied in the radiation-image data readout apparatus according to the present invention. However, the line sensor according to the present invention is not limited to being utilized in a radiation-image data readout apparatus, but can be applied to any type of apparatus requiring that readout be performed by a line sensor having a broad-width light-receiving portion.

What is claimed is:

1. A line sensor comprising
   a photoelectric converting portion formed of a plurality of photodiodes disposed in a row at predetermined intervals,
   a charge transmitting portion for receiving and transmitting the charge from each of the photodiodes of the photoelectric converting portion,
   and a readout gate disposed between the photoelectric converting portion and the charge transmitting portion, wherein
   each of said photodiodes comprises a plurality of regions,
   each of said plurality of regions comprising a different quantity of ion particles which have been poured into said plurality of regions, forming a potential-inclination configuration where a potential well of each region becomes deeper the closer the region is to the readout gate, corresponding to the quantity of ion particles poured.

2. A line sensor according to claim 1, wherein the quantity of ion particles in each region is greater the closer each region is to the readout gate.

3. A line sensor according to claim 1, wherein each of the plurality of regions substantially includes a predetermined quantity of injected ion particles, said predetermined quantity differing for each region.

4. A line sensor according to claim 1, wherein the potential-inclination configuration exists prior to application of a charging voltage.

5. A line sensor as defined in claim 1, wherein said ion particles are P-type and/or N-type ions.

6. A line sensor as defined in either of claim 1 or 5, wherein the potential-inclination configuration comprises a stepped inclination configuration.

7. A line sensor as defined in claim 6, wherein
   a border between two adjacent regions has a tapered shape such that the width thereof becomes narrower in a direction away from the readout gate.

8. A line sensor as defined in claim 6, wherein
   a border between two adjacent regions has a plurality of tapered shapes that become narrower in a direction away from the readout gate arranged so as to form a zigzag shape.

9. A line sensor according to claim 6, wherein the potential well is deeper for the region adjacent the readout gate.

10. A line sensor according to claim 6, wherein the potential-inclination configuration is continuous.

11. A line sensor according to claim 6, wherein the potential-inclination configuration declines discontinuously and has a steeper inclination at a side closer to the readout gate.

12. A radiation-image data readout apparatus, comprising
   a line light source for irradiating with an excitation light in a line-form a portion of a stimulable phosphor sheet on which radiation-image data has been cumulatively recorded,
   a line sensor for receiving and photoelectrically converting a stimulated emission emitted from the portion of the stimulable phosphor sheet that is irradiated with the excitation light into an output,
   a scanning means for moving the line light source and the line sensor relatively from one end to the other of the phosphor sheet in the direction different from the lengthwise direction of the portions of the phosphor sheet to be irradiated by the excitation light, and
   readout means for sequentially reading out, corresponding to the movement of the scanning means, the output of the line sensor, wherein
   said line sensor is the line sensor according to any of the claim 1 or 5.

13. A radiation-image data readout apparatus, comprising
   a line light source for irradiating with an excitation light in a line-form a portion of a stimulable phosphor sheet on which radiation-image data has been cumulatively recorded,
   a line sensor for receiving and photoelectrically converting a stimulated emission emitted from the portion of the stimulable phosphor sheet that is irradiated with the excitation light into an output,
   a scanning means for moving the line light source and the line sensor relatively from one end to the other of the phosphor sheet in the direction different from the lengthwise direction of the portions of the phosphor sheet to be irradiated by the excitation light, and
   a readout means for sequentially reading out, corresponding to the movement of the scanning means, the output of the line sensor, wherein
   said line sensor is the line sensor according to claim 6.

14. A radiation-image data readout apparatus, comprising
   a line light source for irradiating with an excitation light in a line-form a portion of a stimulable phosphor sheet on which radiation-image data has been cumulatively recorded,
   a line sensor for receiving and photoelectrically converting a stimulated emission emitted from the portion of the stimulable phosphor sheet that is irradiated with the excitation light into an output,
   a scanning means for moving the line light source and the line sensor relatively from one end to the other of the phosphor sheet in the direction different from the lengthwise direction of the portions of the phosphor sheet to be irradiated by the excitation light, and
   readout means for sequentially reading out, corresponding to the movement of the scanning means, the output of the line sensor, wherein
   said line sensor is the line sensor according to claim 7.

15. A radiation-image data readout apparatus, comprising
a line light source for irradiating with an excitation light in a line-form a portion of a stimulable phosphor sheet on which radiation-image data has been cumulatively recorded,
a line sensor for receiving and photoelectrically converting a stimulated emission emitted from the portion of the stimulable phosphor sheet that is irradiated with the excitation light into an output,
a scanning means for moving the line light source and the line sensor relatively from one end to the other of the phosphor sheet in the direction different from the lengthwise direction of the portions of the phosphor sheet to be irradiated by the excitation light, and
readout means for sequentially reading out, corresponding to the movement of the scanning means, the output of the line sensor, wherein
said line sensor is the line sensor according to claim 8.

* * * * *